(12) United States Patent
Kim et al.

(10) Patent No.: US 11,206,500 B2
(45) Date of Patent: Dec. 21, 2021

(54) BONE CONDUCTION SPEAKER

(71) Applicant: EM-TECH Co., Ltd., Gyeongsangnam-do (KR)

(72) Inventors: Cheon Myeong Kim, Gyeongsangnam-do (KR); Jae Hwa Lim, Gyeongsangnam-do (KR); Jeong Ae Ha, Gyeongsangnam-do (KR); Ji Young Lee, Gyeongsangnam-do (KR); Byung Ho Jung, Gyeongsangnam-do (KR); Sung Jin Hong, Gyeonggi-do (KR)

(73) Assignee: EM-TECH CO., LTD., Gyeongsangnam-Do (KR)

( * ) Notice: Subject to any disclaimer, the term of this patent is extended or adjusted under 35 U.S.C. 154(b) by 15 days.

(21) Appl. No.: 16/814,570

(22) Filed: Mar. 10, 2020

(65) Prior Publication Data

US 2020/0296526 A1 Sep. 17, 2020

(30) Foreign Application Priority Data

Mar. 12, 2019 (KR) .................. 10-2019-0027946

(51) Int. Cl.
*H04R 11/02* (2006.01)
*H04R 25/00* (2006.01)
(Continued)

(52) U.S. Cl.
CPC .......... *H04R 25/606* (2013.01); *H04R 9/046* (2013.01); *H04R 17/10* (2013.01); *H05K 1/189* (2013.01); *H04R 2460/13* (2013.01)

(58) Field of Classification Search
CPC ........ H04R 11/00; H04R 11/02; H04R 13/00; H04R 13/02; H04R 17/00; H04R 17/005; H02K 33/04
See application file for complete search history.

(56) References Cited

U.S. PATENT DOCUMENTS 2,000,165 A * 5/1935 Erickson ................ H04R 11/00
381/151
2,136,720 A * 11/1938 White .................... H04R 11/00
381/151
(Continued)

FOREIGN PATENT DOCUMENTS

JP 2004507951 A 3/2004
JP 2010527213 A 8/2010
(Continued)

*Primary Examiner* — Ryan Robinson
(74) *Attorney, Agent, or Firm* — Murphy, Bilak & Homiller, PLLC

(57) ABSTRACT

A bone conduction speaker is provided. The bone conduction speaker includes: a housing forming an exterior; a stator including a pole piece fitted to a bottom of the housing and a voice coil arranged to an outer circumference of the pole piece; a vibrator including a permanent magnet mounted concentrically with the pole piece and voice coil, with an air gap from the pole piece, a weight attached to the permanent magnet to increase a vibration force, and a yoke attached to the permanent magnet and weight; a flexible printed circuit board mounted on the bottom of the housing, part of which extends out of the housing, and configured to transmit a signal to the voice coil; and a bone conduction pad attached to an outer surface of the housing. The vibration of the vibrator is transmitted to a bone of a user through the housing and bone conduction pad.

10 Claims, 7 Drawing Sheets

(51) Int. Cl.
*H04R 9/04* (2006.01)
*H05K 1/18* (2006.01)
*H04R 17/10* (2006.01)

(56) References Cited

U.S. PATENT DOCUMENTS

| | | | | |
|---|---|---|---|---|
| 2,804,509 | A * | 8/1957 | Knauert | H04R 11/00 |
| | | | | 381/151 |
| 3,030,456 | A * | 4/1962 | Knauert | H04R 11/00 |
| | | | | 381/326 |
| 6,389,148 | B1 * | 5/2002 | Yoo | H04R 11/02 |
| | | | | 381/417 |
| 7,471,801 | B2 * | 12/2008 | Hakansson | H04R 9/025 |
| | | | | 381/326 |
| 9,716,953 | B2 * | 7/2017 | Andersson | H04R 25/606 |
| 10,893,348 | B2 * | 1/2021 | Kim | H04R 9/066 |
| 2019/0319568 | A1 * | 10/2019 | Son | H02P 25/032 |
| 2019/0334076 | A1 * | 10/2019 | Kim | H01L 41/0913 |
| 2020/0057475 | A1 * | 2/2020 | Ahn | G06F 3/0412 |
| 2020/0274412 | A1 * | 8/2020 | Kang | H02K 33/16 |

FOREIGN PATENT DOCUMENTS

| | | | |
|---|---|---|---|
| JP | 2015126463 | A | 7/2015 |
| JP | 2016019180 | A | 2/2016 |
| JP | 6143321 | B1 | 5/2017 |
| JP | 2018186572 | A | 11/2018 |
| KR | 200221515 | Y1 * | 4/2001 |
| KR | 200221515 | Y1 | 4/2001 |
| KR | 20090052171 | A | 5/2009 |
| KR | 20140115015 | A | 9/2014 |
| KR | 20180010288 | A | 1/2018 |
| WO | 2015198683 | A1 | 12/2015 |

\* cited by examiner

BONE CONDUCTION SPEAKER

TECHNICAL FIELD

Embodiments described herein relate to a bone conduction speaker.

BACKGROUND

Generally, when a person hears sound, sound waves are transmitted to the inner ear through the eardrum and tympanic bones, allowing the hearer to perceive the sound. Patients with hearing loss caused by diseases such as eardrum damage and otitis media, acoustic injury resulting from exposure to excessive noise, ageing, and so on can usually use hearing aids to compensate for their hearing loss.

Of these hearing aids, there are hearing aids that can easily compensate for hearing loss by using a bone conduction speaker which converts electric signals into vibrations to enable people with hearing loss to perceive sound. This bone conduction speaker works by transmitting sound vibrations to the auditory ossicles through the skull and relaying sound waves to the auditory nerve of the human body, rather than by vibrating the eardrum to make sound audible.

FIG. 1 is a view showing a conventional bone conduction speaker. Inside a main body 10, a yoke 11, a magnet 12, a voice coil 13, a lower diaphragm 14, a vibrating spring 15, and an upper diaphragm 16 are formed sequentially from bottom to top. Here, the yoke 11 and magnet 12, which are relatively heavy, are placed in a lower portion of the main body 10, and the voice coil 13, lower diaphragm 14, vibrating spring 15, and upper diaphragm 16, which are relatively lightweight, are placed in an upper portion of the main body 10.

When an electric signal is inputted into a signal input part 17, vibration is transmitted from the voice coil 13 sequentially to the lower diaphragm 14, vibrating spring 15, and upper diaphragm 16, and the vibration of the upper diaphragm 16 stimulates the auditory nerve of the human body through the skull, enabling the user to hear the sound.

The conventional bone conduction speaker does not show good performance with low- and high-frequency sounds, because it needs to vibrate solid bones and high-frequency sound components are offset as they pass through the bones. Moreover, the speaker needs to be attached to the skin to produce sound through the vibration of bones, increasing fatigue when wearing for a long time.

SUMMARY

Embodiments described herein provide a bone conduction speaker capable of reducing a user's fatigue while wearing it.

According an embodiment, there is provided a bone conduction speaker comprising: a housing forming the exterior; a stator comprising a pole piece fitted to the bottom of the housing and a voice coil arranged to the outer circumference of the pole piece; a vibrator comprising a permanent magnet mounted concentrically with the pole piece and the voice coil, with an air gap from the pole piece, a weight attached to the permanent magnet to increase a vibration force, and a yoke attached to the permanent magnet and the weight; a flexible printed circuit board (F-PCB) mounted on the bottom of the housing, part of which extends out of the housing, for transmitting a signal to the voice coil; and a bone conduction pad attached to the outer surface of the housing, wherein the vibration of the vibrator is transmitted to a user's bones through the housing and the bone conduction pad.

In some embodiments, a magnetic fluid may be applied around the pole piece and the permanent magnet, so that the amplitude of the vibrator is limited when there is low-frequency resonance.

In some embodiments, the bone conduction speaker may further comprise a piezoelectric element attached to the housing, for transmitting a high-frequency signal.

In some embodiments, the F-PCB may comprise a chip resistor in a circuit that transmits a signal to the piezoelectric element to prevent overcurrent at high frequencies.

In some embodiments, the bone conduction speaker may further comprise an external structure enclosing the exterior of the housing, one side of which is open, wherein the bottom of the bone conduction pad is enclosed with a sidewall of the external structure.

In some embodiments, the bone conduction pad may be bonded to the housing or attached by pressure to one sidewall of the external structure.

In some embodiments, the bone conduction speaker may further comprise a sound leakage prevention structure fitted between the external structure and the housing.

In some embodiments, sound emission holes may be formed in the side of the external structure so that sound is produced by air conduction.

In some embodiments, the housing may be circular or polygonal.

The bone conduction speaker described herein reduces user fatigue while wearing it by generating vibration through indirect bone conduction since the vibration of the vibrator is transmitted through the housing and an elastic member.

Those skilled in the art will recognize additional features and advantages upon reading the following detailed description, and upon viewing the accompanying drawings.

DETAILED DESCRIPTION

Hereinafter, embodiments will be described in more detail with reference to the drawings.

Figure 1:
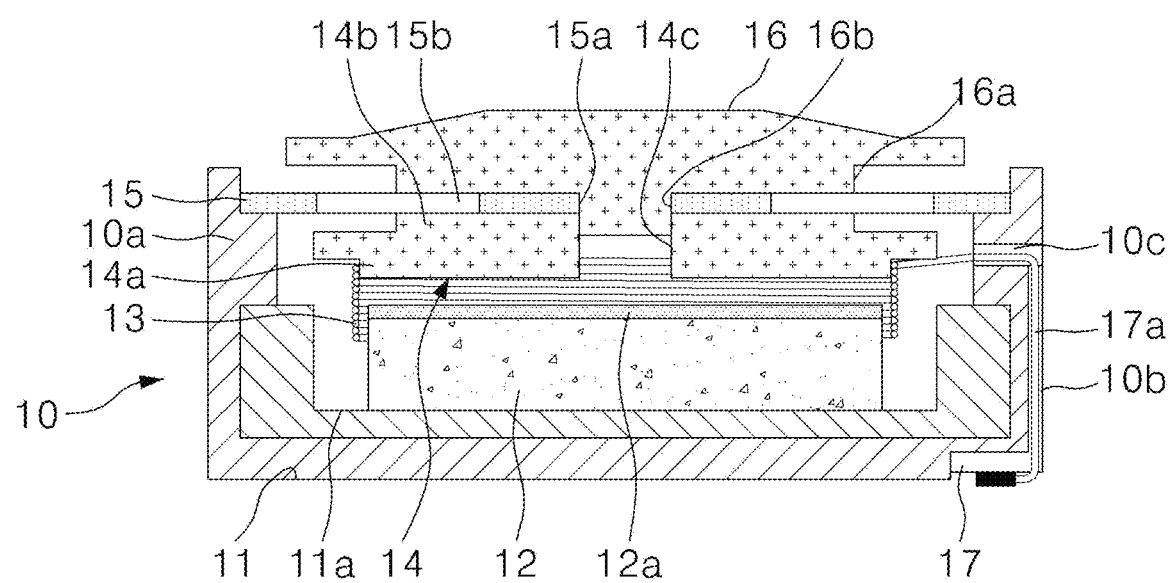
FIG. 1 is a view showing a conventional bone conduction speaker.
Figure 2:
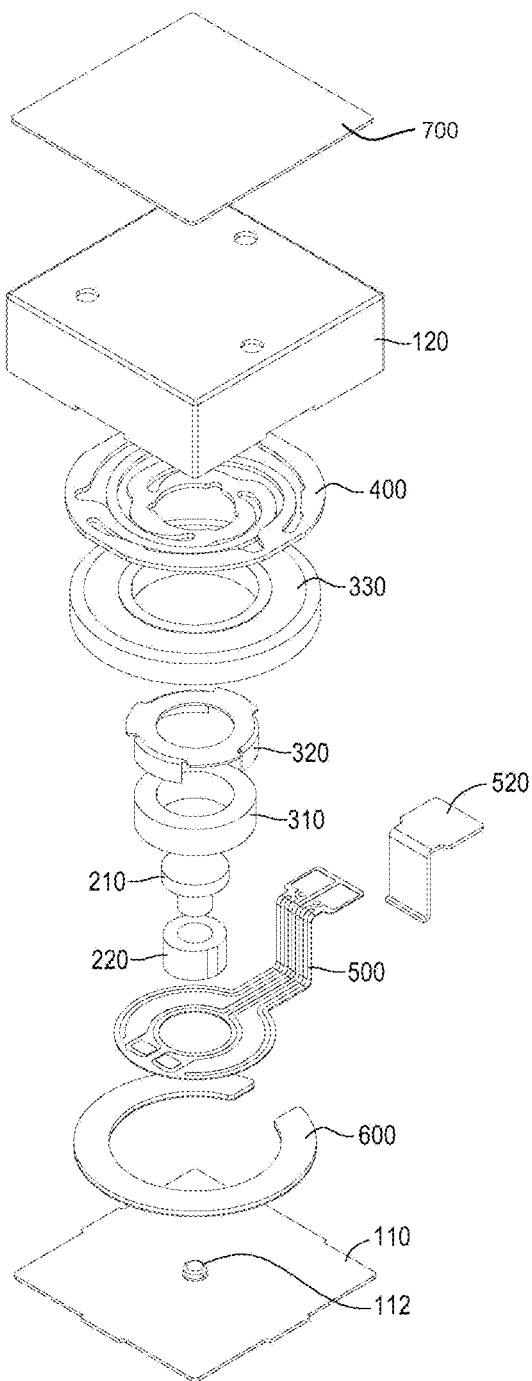
FIG. 2 is an exploded perspective view of a bone conduction speaker according to a first embodiment.
Figure 3:
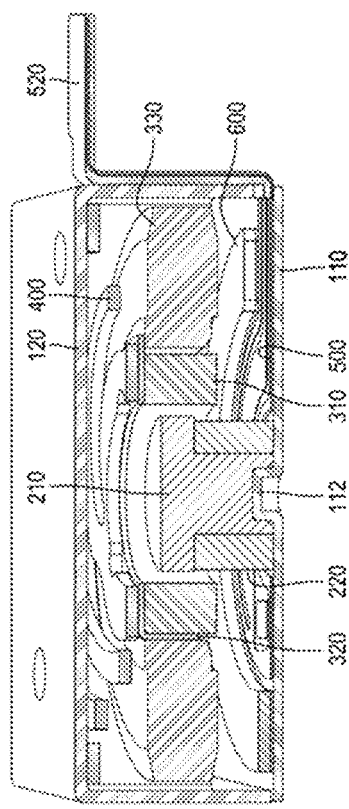
FIG. 3 is a cross-sectional view of the bone conduction speaker according to the first embodiment.

FIG. 2 is an exploded perspective view of a bone conduction speaker according to a first embodiment. FIG. 3 is a cross-sectional view of the bone conduction speaker according to the first embodiment.

In the bone conduction speaker according to the first embodiment, parts are mounted in a housing formed by joining together a lower housing 110 forming the bottom and an upper housing 120 forming the side and top. A pole piece 210 forming a stator is attached to the bottom of the lower housing 110, and a wound coil 220 is attached to the outer circumference of the pole piece 210. In this case, a cylindrical coupling boss 112 protruding toward the inside, i.e., upward, is formed at the center of the lower housing 110, and the coupling boss 112 of the lower housing 110 may be inserted and fixed into the pole piece 210.

A vibrator that vibrates vertically by a mutual electromagnetic force is placed on the same axis as the stator 210 and 220. The vibrator comprises a ring-shaped permanent magnet 310 placed with an air gap from the stator 210 and 220, a yoke 320 attached to the outer circumference of the permanent magnet 310, and a weight 330 attached to the outside of the yoke 320 to add more vibration force to the vibrator. Here, the weight 330 is preferably made of tungsten. An elastic member 400 elastically supporting the vibrator may be interposed between the vibrator and the housings 110 and 120. Although the first embodiment is described with an example in which the elastic member 400 is fitted between the upper housing 120 and the vibrator, the elastic member 400 may be fitted between the lower housing 110 and the vibrator.

In the first embodiment, the upper and lower housings 110 and 120, vibrator, and stator are all circular in shape. Thus, the elastic member 400, too, is circular-shaped, with its outer circumference being fixed to the upper housing 120 and its center being fixed to the vibrator. However, the housings 110 and 120, vibrator 310, 320, and 330, and stator 210 and 220 may be rectangular, in which case two or more elastic members 400 may be provided and the shape of the elastic members 400 may be altered.

A flexible printed circuit board (F-PCB) 500 for transmitting an electric signal to the coil 220 may be provided on an inner surface of the lower housing 110. Part of the F-PCB 500 may extend out of the housings 110 and 120, and a terminal electrically connected to an external terminal may be provided where the F-PCB 500 is exposed out of the housings 110 and 120. A terminal connecting to the voice coil 220 is provided in the part of the F-PCB 500 that is located within the housings 110 and 120. In this case, an anti-crack damper 600 may be provided to prevent cracks on the F-PCB 500 caused by the impact of vibration on the F-PCB 500 from the vibrator. Moreover, a pad plate 520 may be mounted on one side of the housings 110 and 120, to where the F-PCB 500 can be pulled out of the housings 110 and 120 so as to be soldered to the external terminal.

Additionally, a bone conduction pad 700 made of an elastic material is attached to an outer surface of the upper housing 120 forming the side and top. Unlike a conventional bone conduction speaker in which the vibrator generates vibration through direct bone conduction, vibration is generated through indirect bone conduction since the vibration of the vibrator is transmitted through the elastic member 400, housings 110 and 120, and bone conduction pad 700, thus offering the advantage of reducing the user's fatigue while wearing the bone conduction speaker.

Furthermore, since the vibrator is made up of the permanent magnet 310, yoke 320, and weight 330, the vibrator is heavier as compared to that of the conventional bone conduction speaker which works through the vibration of a coil, thereby offering the advantage of giving better low-frequency performance than the conventional bone conduction speaker.

Although the housings 110 and 120 and vibrator of the bone conduction speaker are illustrated to be rectangular, they also may be circular or have other polygonal shapes.

Figure 4:
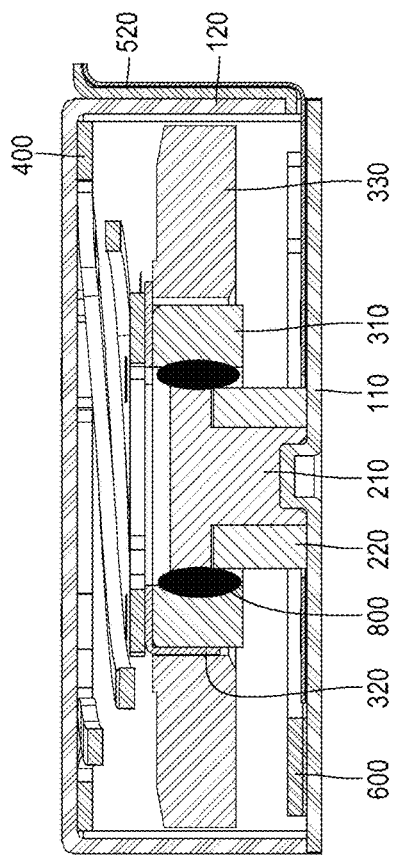
FIG. 4 is a view showing a bone conduction speaker according to a second embodiment.

FIG. 4 is a view showing a bone conduction speaker according to a second embodiment. All of the components in the bone conduction speaker according to the second embodiment are identical to those of the first embodiment, except that a magnetic fluid 800 is applied around the pole piece 210 and the permanent magnet 310. If the output is increased in the presence of low-frequency resonance, the wearer will experience itchiness and pain due to high vibration acceleration, making it difficult to use the bone conduction speaker for a long time, which is an obstacle to increasing the output.

In the second embodiment, the magnetic fluid 800 is applied around the pole piece 210 and the permanent magnet 310, so that the amplitude of the vibrator is limited to reduce the vibration acceleration near the resonance point. Due to the reduction in vibration acceleration at the resonance point, the output of low-frequency sounds around the resonant frequency is increased, leading to higher low-frequency performance.

Figure 5:
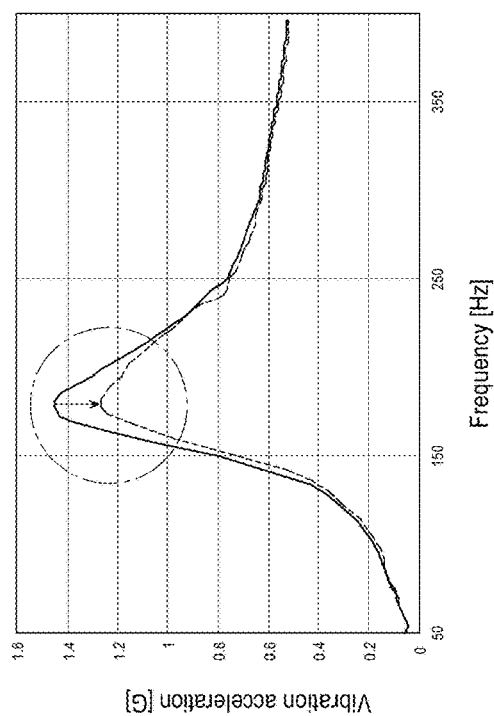
FIG. 5 is a graph showing the vibration acceleration vs. frequency measured when a magnetic fluid is applied around the pole piece and the permanent magnet and when not.

FIG. 5 is a graph showing the vibration acceleration vs. frequency measured when a magnetic fluid is applied around the pole piece and the permanent magnet and when not. It is observed that the vibration acceleration is reduced near the resonance frequency when the magnetic fluid is applied as indicated by the blue line, compared to when the magnetic fluid is not applied as indicated by the red line.

Figure 6:
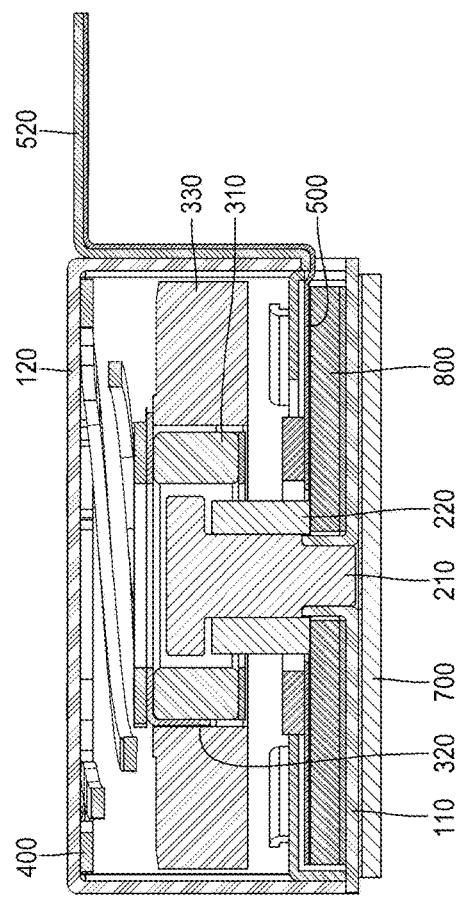
FIG. 6 is a view showing a bone conduction speaker according to a third embodiment.

FIG. 6 is a view showing a bone conduction speaker according to a third embodiment. The third embodiment is identical to the first or second embodiment, except that a piezoelectric element 810 capable of generating vibration is added to generate vibration in the lower housing.

The piezoelectric element 810 is in charge of high-frequency generation, and may improve high-frequency performance compared to when the piezoelectric element is not provided.

Figure 8:
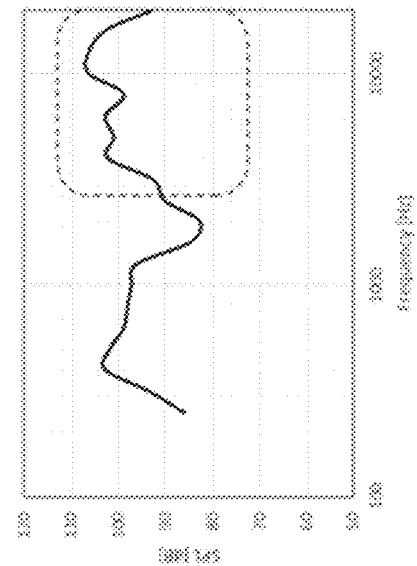
FIG. 8 is a graph showing the sound pressure vs. frequency of a bone conduction speaker with a piezoelectric element.
Figure 7:
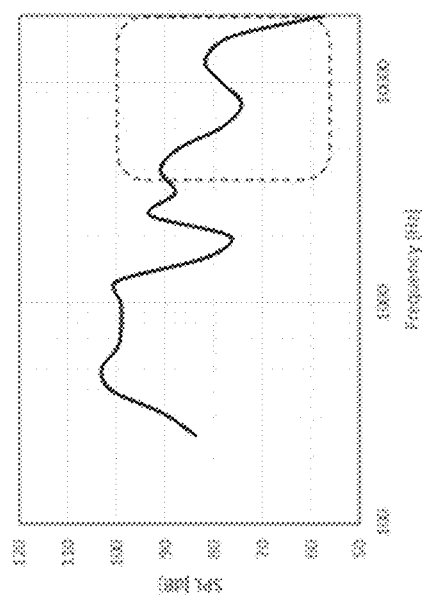
FIG. 7 is a graph showing the sound pressure vs. frequency of a bone conduction speaker with no piezoelectric element.

FIG. 7 is a graph showing the sound pressure vs. frequency of a bone conduction speaker with no piezoelectric element. FIG. 8 is a graph showing the sound pressure vs. frequency of a bone conduction speaker with a piezoelectric element. A comparison of the two graphs shows that the output is far much higher at high frequencies of 4 kHz or above when the piezoelectric element is added.

Figure 9:
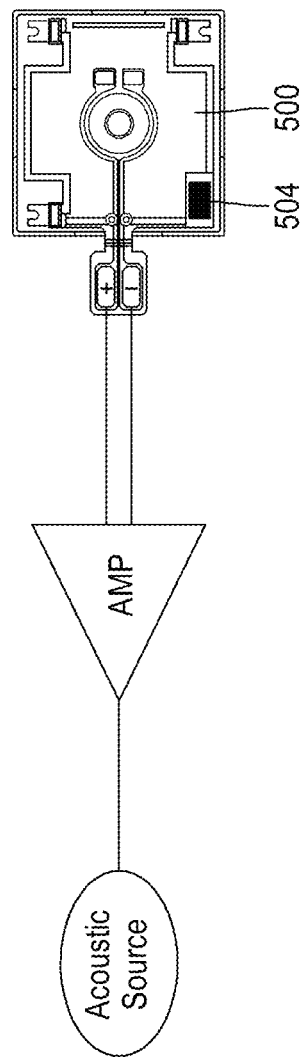
FIG. 9 is a view schematically showing a circuit in a bone conduction speaker in which a chip resistor for the piezoelectric element is provided on an F-PCB.

FIG. 9 is a view schematically showing a circuit in a bone conduction speaker in which a chip resistor for the piezoelectric element is provided on a flexible printed circuit board (F-PCB) 500. In the case where the bone conduction speaker has a piezoelectric element as an acoustic source 502, as in the third embodiment, a dedicated amplifier 503 for the piezoelectric element-based acoustic source 502 may be provided to prevent overcurrent at high frequencies where the piezoelectric element 502 operates, or a chip resistor 504 may be provided on the F-PCB 500.

Figure 10:
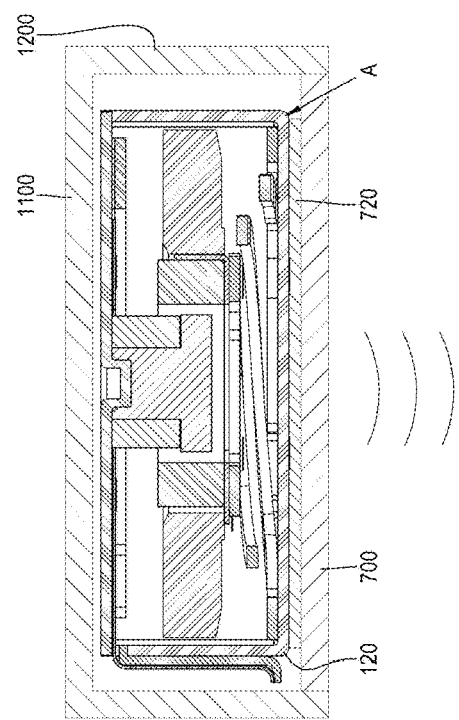
FIG. 10 is a cross-sectional view showing a bone conduction speaker according to a fourth embodiment.

FIG. 10 is a cross-sectional view showing a bone conduction speaker according to a fourth embodiment. The bone conduction speaker according to the fourth embodiment further comprises an external structure 1100 and 1200 enclosing the exterior of the housings 110 and 120, one side of which is open. Accordingly, the external structure 1100 and 1200 has a top 1100 and a sidewall 1200. A bone conduction pad 700 is located on the open side. That is, the bone conduction pad 700 is enclosed with the sidewall 1200 of the external structure 1100 and 1200.

Of the housings 110 and 120 of the bone conduction speaker A, the upper housing 120 with the sidewall and top allows for efficient vibration transmission because it has higher rigidity than the lower housing 110 which is planar. Thus, the upper housing 120 and the bone conduction pad 700 are fitted in such a way as to make contact with each other, and vibration is transmitted from the upper housing 120 to the bone conduction pad 700. In this case, the upper housing 120 and the bone conduction pad 700 are bonded together with an adhesive material 720. Glue or double-sided tape may be used as the adhesive material 720.

Figure 11:
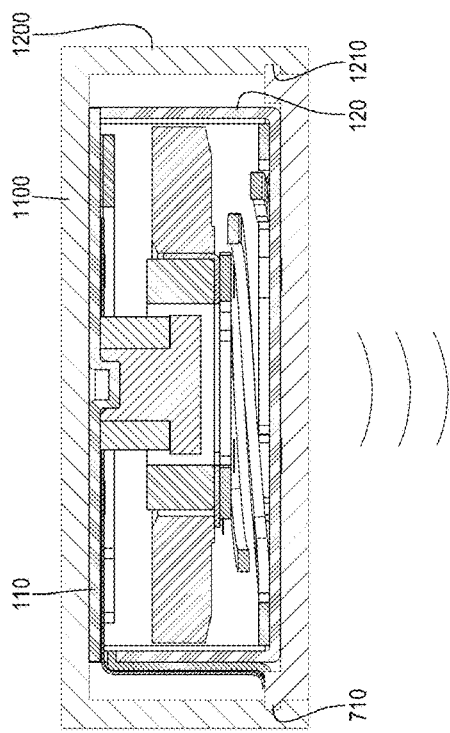
FIG. 11 is a cross-sectional view showing a bone conduction speaker according to a fifth embodiment.

FIG. 11 is a cross-sectional view showing a bone conduction speaker according to a fifth embodiment. The difference with the fourth embodiment is the structure for fixing the bone conduction pad, although all of the other components are identical to those of the fourth embodiment. In the fifth embodiment, a recessed portion 1210 is formed in the sidewall 1200 of the external structure 1100 and 1200, and the bone conduction pad 700 is formed with a protrusion 710 for insertion into the recessed portion 1210. As the protrusion 710 is press-fitted into the recessed portion 1210, the bone conduction pad 700 is fixed.

Figure 12:
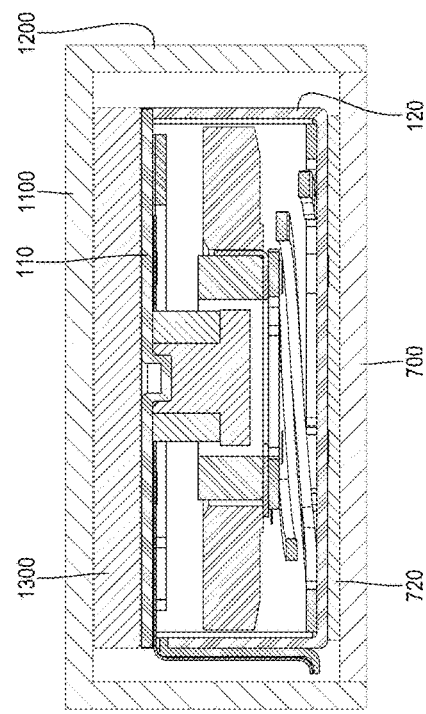
FIG. 12 is a cross-sectional view showing a bone conduction speaker according to a sixth embodiment.

FIG. 12 is a cross-sectional view showing a bone conduction speaker according to a sixth embodiment. The difference with the fourth embodiment is that a sound leakage prevention structure 1300 for preventing sound leakage is provided between the external structure 1100 and 1200 and the bone conduction speaker, although all of the other components are identical to those of the fourth embodiment. The sound leakage prevention structure 1300 is fitted between the external structure 1100 and 1200 and the lower housing 110 which are on the other side of the bone conduction pad 700. Preferably, the sound leakage prevention structure 1300 is made of an elastic material with low vibration transmissibility so as to absorb vibration well between the external structure 1100 and 1200 and the bone conduction speaker.

Figure 13:
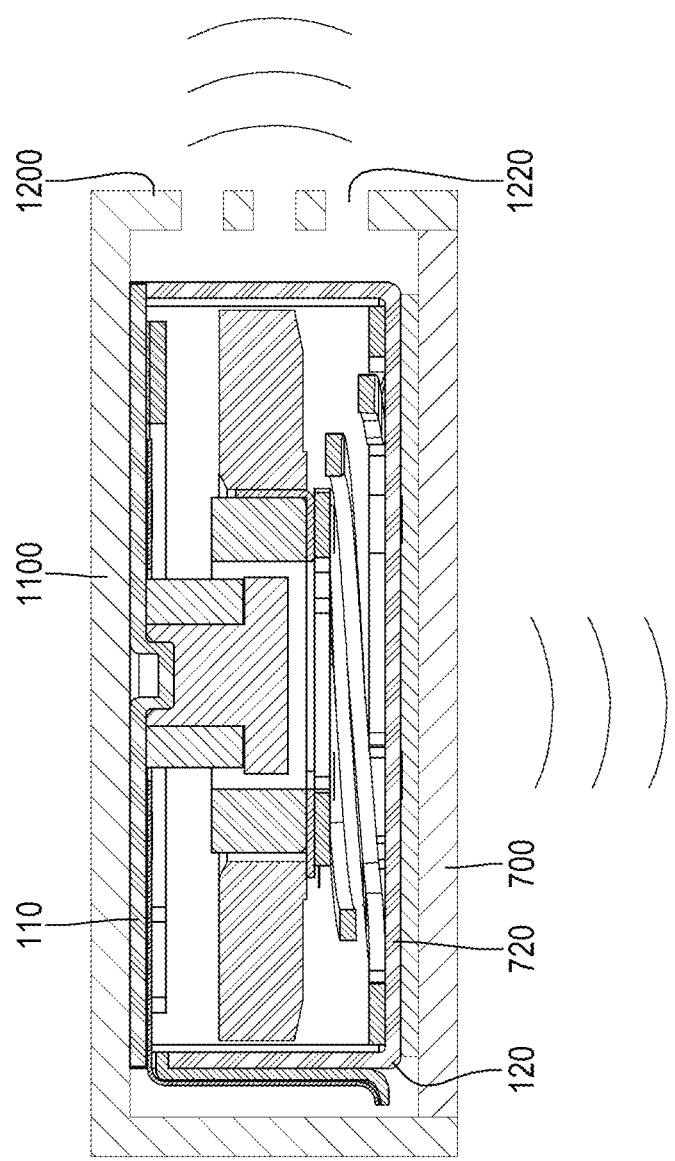
FIG. 13 is a cross-sectional view showing a bone conduction speaker according to a seventh embodiment.

FIG. 13 is a cross-sectional view showing a bone conduction speaker according to a seventh embodiment. The difference with the fourth embodiment is that sound emission holes 1220 are formed in the sidewall 1200 of the external structure 1100 and 1200, although all of the other components are identical to those of the fourth embodiment. By forming the sound emission holes 1220 in the sidewall 1200, the sound produced by the vibration of the bone conduction pad 700 may be transmitted by air conduction through the sound emission holes 1220.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A bone conduction speaker, comprising:
    a housing forming an exterior;
    a stator comprising a pole piece fitted to a bottom of the housing and a voice coil arranged to an outer circumference of the pole piece;
    a vibrator comprising a permanent magnet mounted concentrically with the pole piece and the voice coil, with an air gap from the pole piece and a weight attached to the permanent magnet to increase a vibration force, and a yoke attached to the permanent magnet and the weight;
    a flexible printed circuit board (F-PCB) mounted on the bottom of the housing, part of which extends out of the housing, and configured to transmit a signal to the voice coil;
    an external structure enclosing the exterior of the housing, one side of which is open; and
    a bone conduction pad attached to an outer surface of the housing and enclosed with a sidewall of the external structure,
    wherein vibration of the vibrator is transmitted to a bone of a user through the housing and the bone conduction pad.

2. The bone conduction speaker of claim 1, wherein a magnetic fluid is applied around the pole piece and the permanent magnet, so that an amplitude of the vibrator is limited in a low-frequency resonance condition.

3. The bone conduction speaker of claim 1, further comprising a piezoelectric element attached to the housing and configured to transmit a high-frequency signal.

4. The bone conduction speaker of claim 3, wherein the F-PCB comprises a chip resistor in a circuit configured to transmit a signal to the piezoelectric element to prevent overcurrent at high frequencies.

5. The bone conduction speaker of claim 1, wherein the bone conduction pad is bonded to the housing.

6. The bone conduction speaker of claim 1, wherein the bone conduction pad is attached by pressure to one side of the external structure.

7. The bone conduction speaker of claim 1, further comprising a sound leakage prevention structure fitted between the external structure and the housing.

8. The bone conduction speaker of claim 1, wherein sound emission holes are formed in the side of the external structure so that sound is produced by air conduction.

9. The bone conduction speaker of claim 1, wherein the housing is circular shaped.

10. The bone conduction speaker of claim 1, wherein the housing is polygonal shaped.

* * * * *